United States Patent
Ito

(10) Patent No.: US 10,734,969 B2
(45) Date of Patent: Aug. 4, 2020

(54) VIBRATOR DEVICE, OSCILLATOR, ELECTRONIC DEVICE, AND VEHICLE

(71) Applicant: SEIKO EPSON CORPORATION, Tokyo (JP)

(72) Inventor: Hisahiro Ito, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/914,359

(22) Filed: Mar. 7, 2018

(65) Prior Publication Data
US 2018/0269850 A1 Sep. 20, 2018

(30) Foreign Application Priority Data
Mar. 15, 2017 (JP) .................. 2017-049700

(51) Int. Cl.
| | |
|---|---|
| H01L 23/48 | (2006.01) |
| H03H 9/05 | (2006.01) |
| H01L 23/498 | (2006.01) |
| H03H 9/02 | (2006.01) |
| H03H 9/10 | (2006.01) |
| H01L 23/495 | (2006.01) |
| H03H 9/145 | (2006.01) |
| H03H 9/19 | (2006.01) |
| H03H 9/25 | (2006.01) |
| H03B 5/32 | (2006.01) |

(52) U.S. Cl.
CPC ......... *H03H 9/0538* (2013.01); *H01L 23/498* (2013.01); *H01L 23/49596* (2013.01); *H03H 9/02551* (2013.01); *H03H 9/02976* (2013.01); *H03H 9/02984* (2013.01); *H03H 9/0547* (2013.01); *H03H 9/0585* (2013.01); *H03H 9/1021* (2013.01); *H03H 9/1071* (2013.01); *H03H 9/145* (2013.01); *H03H 9/19* (2013.01); *H01L 23/4952* (2013.01); *H01L 23/49513* (2013.01); *H01L 23/49541* (2013.01); *H01L 2224/48091* (2013.01); *H01L 2224/48145* (2013.01); *H01L 2224/48247* (2013.01); *H03B 5/32* (2013.01); *H03H 9/25* (2013.01)

(58) Field of Classification Search
CPC ............. H01L 23/49596; H01L 23/498; H01L 23/49513; H03H 9/0538; H03H 9/1071; H03H 9/02551
See application file for complete search history.

(56) References Cited

U.S. PATENT DOCUMENTS

| | | | |
|---|---|---|---|
| 8,022,554 B2 | 9/2011 | Gupta et al. | |
| 2005/0184626 A1* | 8/2005 | Chiba | H03H 9/0547 310/348 |
| 2007/0290364 A1 | 12/2007 | Gupta et al. | |

(Continued)

*Primary Examiner* — Hoa B Trinh
(74) *Attorney, Agent, or Firm* — Oliff PLC

(57) ABSTRACT

A vibrator device includes a circuit element, which has a first terminal and is a quadrangle in plan view, a vibrator, which is disposed on an active surface and is a quadrangle in plan view, a base, on which the circuit element is disposed and which has a second terminal, and a wire which connects the first terminal and the second terminal together. In plan view of the circuit element, at least one side of the vibrator is disposed along a direction where the one side intersects each of two adjacent sides of the circuit element, and the vibrator does not overlap the first terminal.

9 Claims, 12 Drawing Sheets

(56) References Cited

U.S. PATENT DOCUMENTS

| | | | |
|---|---|---|---|
| 2015/0349746 A1* | 12/2015 | Yamazaki | H03H 9/21 310/344 |
| 2016/0020379 A1* | 1/2016 | Ito | B06B 1/0207 310/317 |
| 2016/0123734 A1* | 5/2016 | Nakagawa | G01O 19/56 73/504.16 |
| 2016/0285461 A1* | 9/2016 | Okubo | H03L 1/028 |
| 2017/0359075 A1* | 12/2017 | Kikuchi | H03H 9/0547 |
| 2018/0265349 A1* | 9/2018 | Ito | H03H 9/0519 |
| 2018/0269834 A1* | 9/2018 | Ito | H03H 9/0542 |

\* cited by examiner

VIBRATOR DEVICE, OSCILLATOR, ELECTRONIC DEVICE, AND VEHICLE

BACKGROUND

1. Technical Field

The present invention relates to a vibrator device, an oscillator, an electronic device, and a vehicle.

2. Related Art

For example, a COL package structure that has a lead, a control chip disposed on the lead, and an MEMS chip disposed on the control chip is disclosed in U.S. Unexamined Patent Application Publication No. 2007/0290364.

However, the following problem is likely to arise in a configuration where the MEMS chip is disposed on an active surface of the control chip as in the COL package structure of U.S. Unexamined Patent Application Publication No. 2007/0290364. That is, if the size of the control chip is not sufficiently larger than the size of the MEMS chip, the MEMS chip overlaps terminals of the active surface and thus connecting wires to the terminals is difficult. The terminals may be disposed in a portion that does not overlap the MEMS chip of the active surface to solve this problem, but the plurality of terminals are concentrated since the region that does not overlap the MEMS chip is narrow. For this reason, it is difficult to connect each wire to each of the terminals, and a sufficient space for disposing the wires cannot be ensured.

SUMMARY

An advantage of some aspects of the invention is to provide a vibrator device, an oscillator, an electronic device, and a vehicle, in which wires can be easily connected to terminals provided on an active surface of a circuit element.

The advantage can be achieved by the following configurations.

A vibrator device according to an aspect of the invention includes a circuit element that has a first terminal and is a quadrangle in plan view, a vibrator that is disposed on the circuit element and is a quadrangle in plan view, a base on which the circuit element is disposed and which has a second terminal, and a wire that connects the first terminal and the second terminal together. In plan view of the circuit element, at least one side of the vibrator is disposed along a direction where the one side intersects each of two adjacent sides of the circuit element, and the vibrator does not overlap the first terminal.

With this configuration, the concentration of the first terminal on the circuit element and a bias in the region where the first terminal is disposed can be suppressed. For this reason, a wire can be easily connected to each first terminal and interference between wires can be suppressed.

In the vibrator device according to the aspect of the invention, it is preferable that in the plan view, at least one corner of the vibrator is positioned outside the circuit element.

With this configuration, the area of the region of the circuit element that does not overlap the vibrator can be increased and thus the concentration of the first terminal on the circuit element can be reduced.

In the vibrator device according to the aspect of the invention, it is preferable that in the plan view, at least the one corner of the vibrator is in contact with an outline of the circuit element.

With this configuration, the concentration of the first terminal on the circuit element can be effectively suppressed.

In the vibrator device according to the aspect of the invention, it is preferable that when an area of the circuit element is set as M1 and an area of the vibrator is set as M2 in the plan view, $0.5 \leq M2/M1 \leq 1$ is satisfied.

With this configuration, since the region of the circuit element that does not overlap the vibrator, that is, a region where the first terminal can be disposed is likely to be decreased, the effect described above is more conspicuous.

In the vibrator device according to the aspect of the invention, it is preferable that in the plan view, the plurality of second terminals are disposed on a perimeter of the circuit element and along each of four sides of the circuit element.

By disposing the second terminals along the perimeter of the circuit element as described above, the number of the second terminals is likely to increase and wires are likely to be concentrated. For this reason, the effect described above is more conspicuous.

In the vibrator device according to the aspect of the invention, it is preferable that the vibrator has a vibrator element and a vibrator element package accommodating the vibrator element.

With this configuration, the configuration of the vibrator is simple.

In the vibrator device according to the aspect of the invention, it is preferable that the vibrator element package has a third terminal disposed on a surface on a side opposite to the circuit element.

With this configuration, since the third terminal and the first terminal face the same side, it is easy to connect the terminals together.

In the vibrator device according to the aspect of the invention, it is preferable that a mold portion that is provided on the base and covers the circuit element and the vibrator is further included.

With this configuration, the vibrator and the circuit element can be protected from moisture, dust, and shock, and thus the reliability of the vibrator device improves.

An oscillator according to tan aspect of the invention includes the vibrator device according to the aspect of the invention.

With this configuration, the oscillator, in which an effect of the vibrator device according to the aspect of the invention can be enjoyed and which has high reliability, is obtained.

An electronic device according to an aspect of the invention includes the vibrator device according to the aspect of the invention.

With this configuration, the electronic device, in which an effect of the vibrator device according to the aspect of the invention can be enjoyed and which has high reliability, is obtained.

A vehicle according to an aspect of the invention includes the vibrator device according to the aspect of the invention.

With this configuration, the vehicle, in which an effect of the vibrator device according to the aspect of the invention can be enjoyed and which has high reliability, is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator device, an oscillator, an electronic device, and a vehicle according to the invention will be described in detail based on embodiments illustrated in the attached drawings.

First Embodiment

First, an oscillator (vibrator device) according to a first embodiment of the invention will be described.

Figure 1:
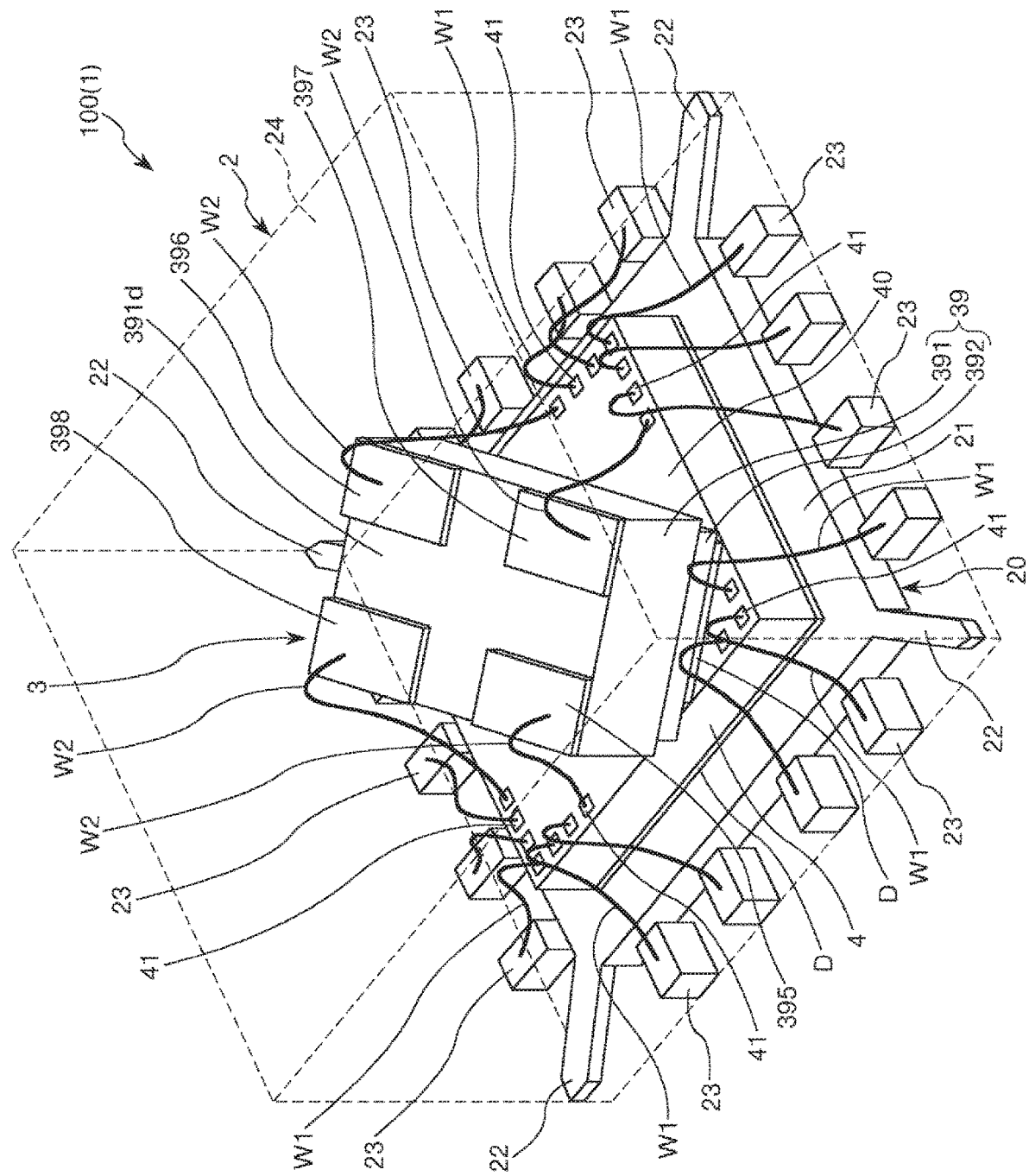
FIG. 1 is a perspective view illustrating an oscillator (vibrator device) according to a first embodiment of the invention.
Figure 2:
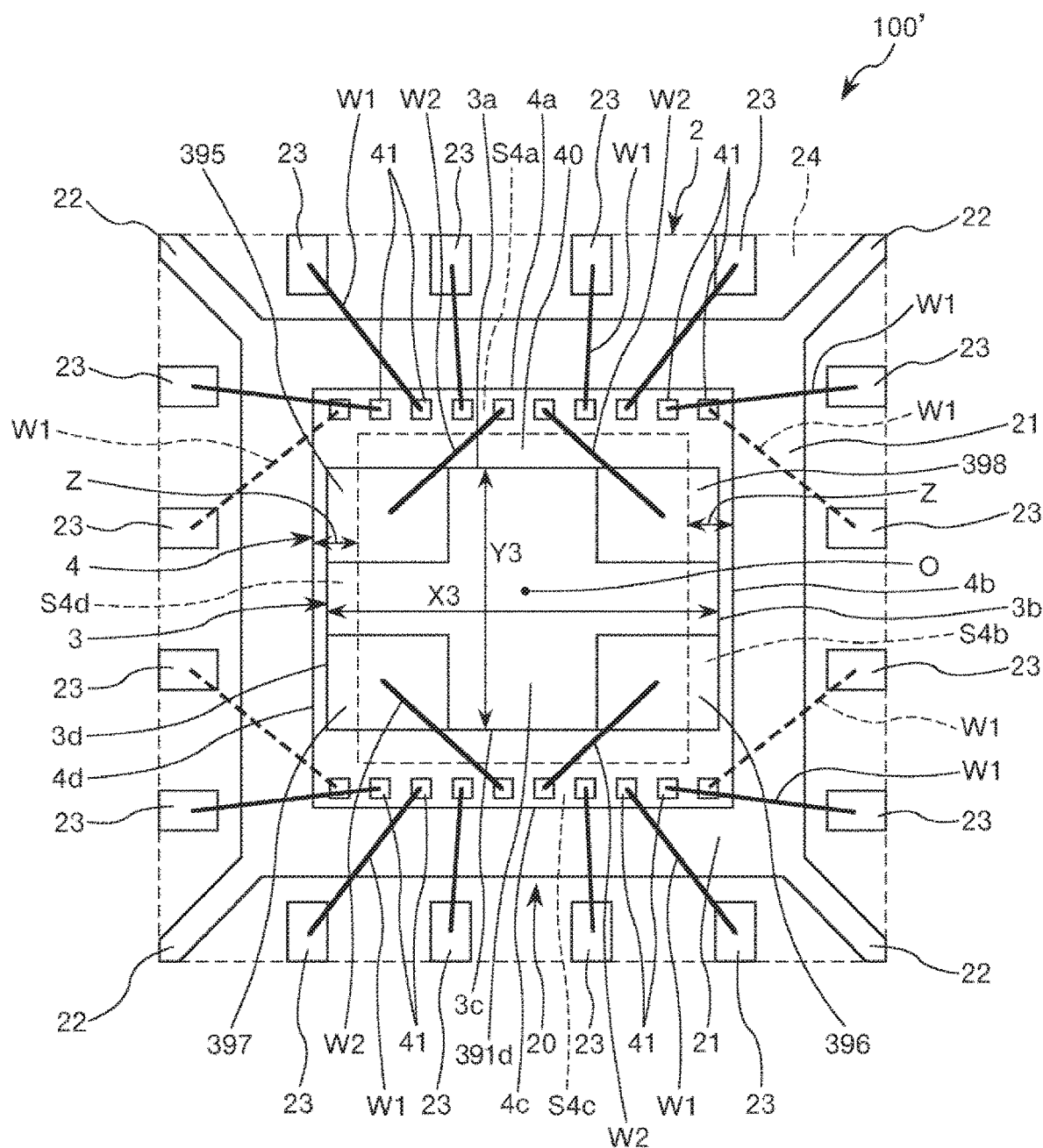
FIG. 2 is a plan view illustrating an oscillator of the related art.
Figure 3:
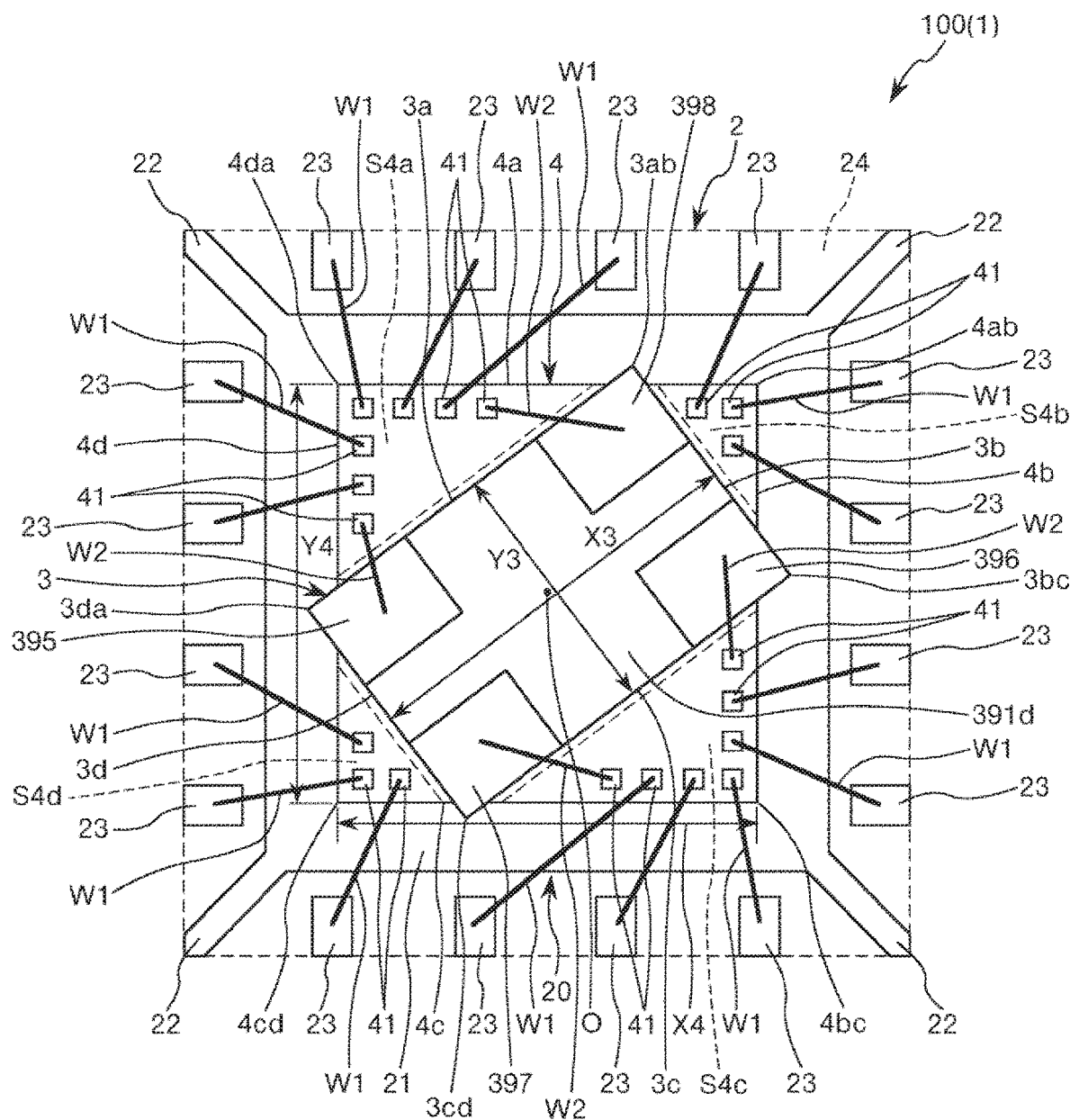
FIG. 3 is a plan view of the oscillator illustrated in FIG. 1.
Figure 4:
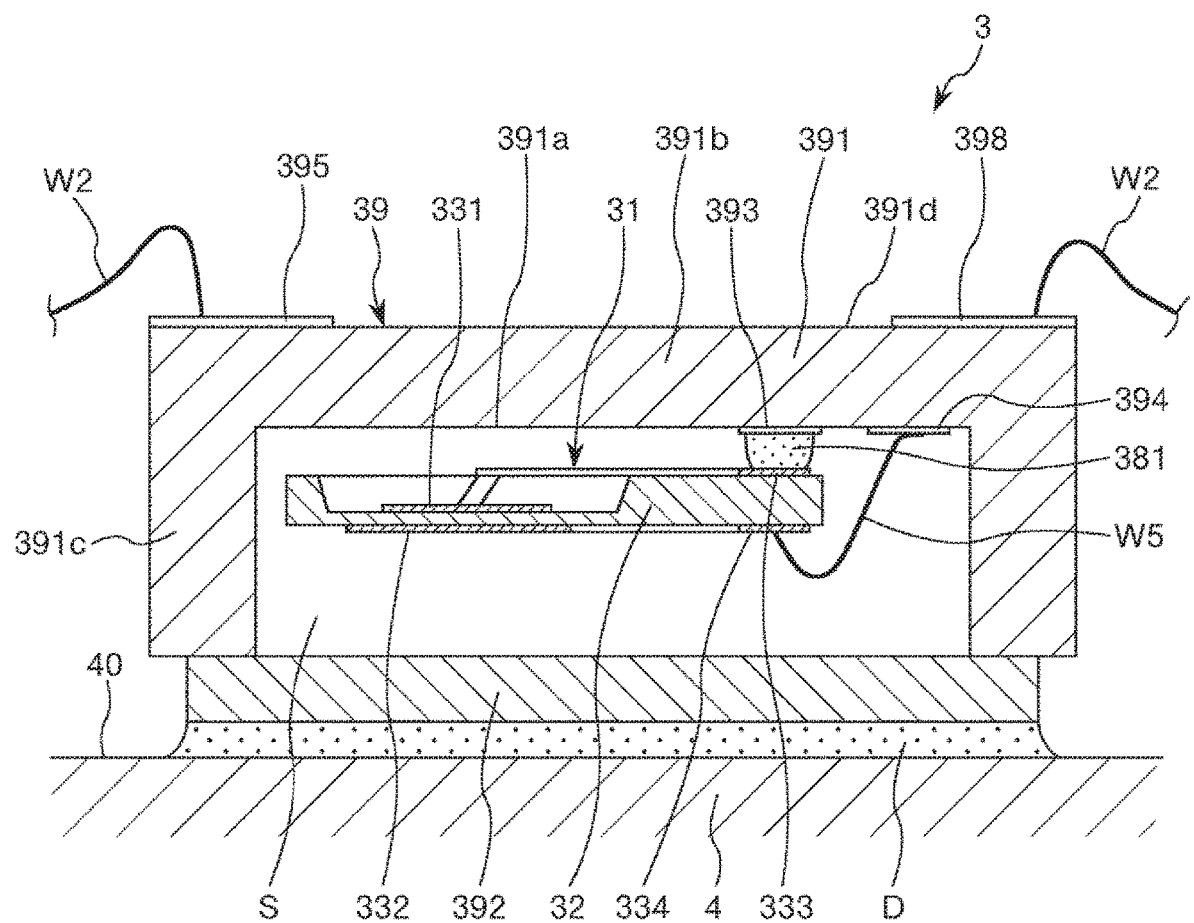
FIG. 4 is a sectional view of a vibrator of the oscillator illustrated in FIG. 1.
Figure 5:
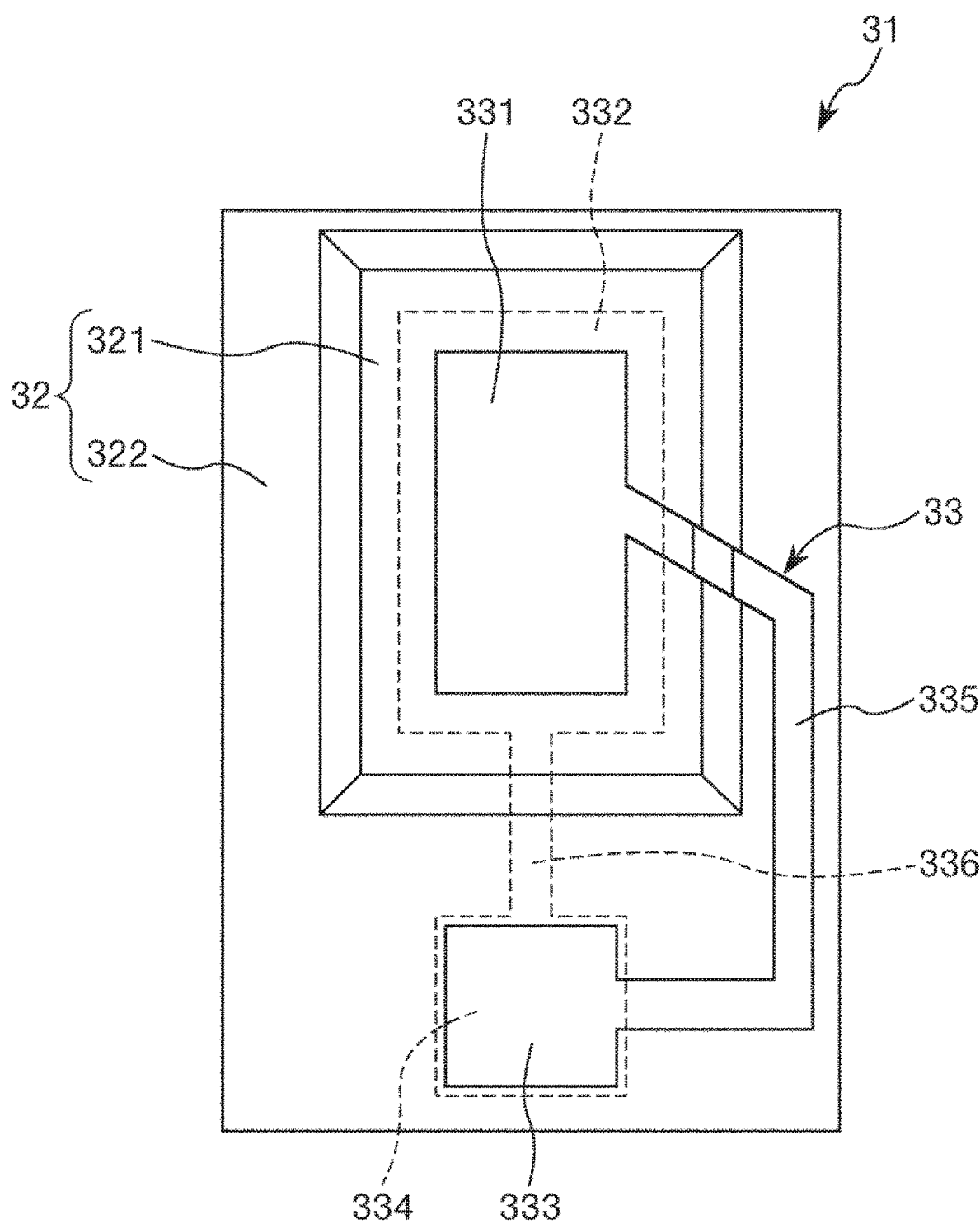
FIG. 5 is a plan view of a vibrator element of the vibrator illustrated in FIG. 4.

FIG. 1 is a perspective view illustrating the oscillator (vibrator device) according to the first embodiment of the invention. FIG. 2 is a plan view illustrating an oscillator of the related art. FIG. 3 is a plan view of the oscillator illustrated in FIG. 1. FIG. 4 is a sectional view of a vibrator of the oscillator illustrated in FIG. 1. FIG. 5 is a plan view of a vibrator element of the vibrator illustrated in FIG. 4. Hereinafter, for convenience of description, an upper side in FIGS. 1 and 4 and a page front side in FIGS. 2 and 3 will also be referred to as "up", and a lower side in FIGS. 1 and 4 and a page depth side of FIGS. 2 and 3 will also be referred to as "down".

A vibrator device 1 illustrated in FIG. 1 is applied to an oscillator 100, and mainly includes a package 2, a vibrator 3, and a circuit element 4. The vibrator 3 is disposed on the circuit element 4.

If the vibrator 3 is disposed such that four sides (a first side 3a, a second side 3b, a third side 3c, and a fourth side 3d) of the vibrator 3 face (are in parallel with) four sides (a first side 4a, a second side 4b, a third side 4c, and a fourth side 4d) of the circuit element 4 as in an oscillator 100' of the related art illustrated in FIG. 2, there is no space to dispose terminals 41 in regions S4b and S4d extending along the second side 4b and the fourth side 4d of an active surface 40, which is atop surface of the circuit element 4. Therefore, it is necessary to dispose the terminals 41 in regions S4a and S4c extending along the first side 4a and the third side 4c of the active surface 40. For this reason, the terminals 41 are concentrated and are biasedly disposed. In this case, if each of the terminals 41 and each of leads 23 of the package 2 are connected together with wires W1, the wires W1 interfere with each other and thus it is difficult to connect each of the wires W1 to each of the terminals 41. For example, connection of the wires W1 illustrated with dashed lines is difficult in FIG. 2.

In the oscillator 100, the vibrator 3 is disposed so as to be tilted with respect to the circuit element 4 as illustrated FIGS. 1 and 3. Consequently, since the terminals 41 can be disposed on each corner (a first corner 4ab, a second corner 4bc, a third corner 4cd, and a fourth corner 4da) of the active surface 40, the concentration of the terminals 41 can be suppressed and the terminals 41 can be disposed in balance on outer edges (in particular, the four corners) of the active surface 40. For this reason, interference between the wires W1 can be suppressed, and it is easy to connect each of the wires W1 to each of the terminals 41. Hereinafter, such an oscillator 100 (vibrator device 1) will be described in detail.

Package

The package 2 is a quad flat non-leaded (QFN) package, and is in a substantially quadrilateral block shape (plate shape) in plan view. Such a package 2 has a base 20 and a mold portion 24 (sealing portion) as illustrated in FIGS. 1 and 3. The base 20 has a die pad 21 (mounting portion) having a substantially quadrilateral plate shape in plan view, four hanging leads 22 connected to corners of the die pad 21, and the plurality of leads 23 (second terminals) disposed along the perimeter of the die pad 21. However, the configuration of the base 20 is not particularly limited. For example, the die pad 21 may not be a substantially quadrangle in plan view.

As illustrated in FIG. 1, the circuit element 4 is bonded and fixed to the top surface of the die pad 21 via a die attach member D. The vibrator 3 is bonded and fixed to the top surface of the circuit element 4 via the die attach member D. The plurality of leads 23 and the circuit element 4 are electrically connected to each other via the wires W1, and the circuit element 4 and the vibrator 3 are electrically connected to each other via wires W2. Each of the wires W1 and W2 is, for example, a bonding wire disposed (formed) using a wire bonding technique. Metal wires, for example, a gold wire, a copper wire, and an aluminum wire can be used as the wires W1 and W2.

The mold portion 24 is provided on the top surface of the base 20 so as to seal the vibrator 3, the circuit element 4, and the wires W1 and W2. Consequently, each of the units can be effectively protected from moisture, dust, and shock, and thus the reliability of the oscillator 100 improves. The configuration materials of the mold portion 24 are not particularly limited. For example, an epoxy based thermosetting resin can be used and a thermosetting resin may contain a filler such as silica.

As illustrated in FIG. 3, each of the four hanging leads 22 extends from a corner of the die pad 21 to each corner of the package 2, and the die pad 21 is supported by the four hanging leads 22. Each of the hanging leads 22 is formed so as to be thinner than the die pad 21 by half etching a bottom surface thereof. The bottom surface of each of the hanging leads 22 is covered with the mold portion 24. Consequently, since each of the hanging leads 22 is not exposed from the bottom surface of the package 2, the mountability of the oscillator 100 improves.

As illustrated in FIG. 3, the plurality of leads 23 are disposed along four sides of the package 2 in plan view of the package 2. However, the disposition of the leads 23 is not particularly limited. For example, the leads may be disposed along one side of the package 2, may be disposed along two sides, or may be disposed along three sides, or one lead may be disposed for each side. The number of the leads 23 is not particularly limited as well, and can be set as appropriate according to a device configuration (for example, the number of terminals of the circuit element 4).

The bottom surface of each of the leads 23 is exposed from the mold portion 24, and the leads are portions (connecting portions) that perform electrical connection with an external device. The top surface of each of the leads 23 is a portion (wire connecting portion) connected to the wires W1.

The package 2 has been described hereinbefore. The configuration material of the base 20 is not particularly limited. Metal materials, such as gold (Au), silver (Ag), platinum (Pt), palladium (Pd), iridium (Ir), copper (Cu), aluminum (Al), nickel (Ni), titanium (Ti), and tungsten (W), and alloys including the metal materials can be given as examples, and out of the materials, one type or a combination (for example, as a stacked object having two or more layers) of two or more types of materials can be used. For example, by patterning one metal plate, the base 20 can be formed collectively with the die pad 21, each of the hanging leads 22, and each of the leads 23.

Vibrator

As illustrated in FIG. 4, the vibrator 3 has a vibrator element 31 and a vibrator element package 39 accommodating the vibrator element 31.

The vibrator element 31 is an AT cut quartz crystal vibrator element that thickness-shear vibrates. Such a vibrator element 31 has an AT cut quartz crystal substrate 32 and an electrode 33 formed on the quartz crystal substrate 32 as illustrated in FIG. 5. The quartz crystal substrate has a thin vibrating portion 321 and a thick portion 322, which is positioned on the perimeter of the vibrating portion 321 and is thicker than the vibrating portion 321. The thin vibrating portion 321 is formed by forming a recessed portion in one surface of the quartz crystal substrate 32.

The electrode 33 has a pair of excitation electrodes 331 and 332, a pair of pad electrodes 333 and 334, and a pair of extraction electrodes 335 and 336. The excitation electrode 331 is disposed on an exterior surface of the vibrating portion 321. On the other hand, the excitation electrode 332 is disposed on an interior surface of the vibrating portion 321 so as to oppose the excitation electrode 331. In such a configuration, a region of the vibrating portion 321 sandwiched between the excitation electrodes 331 and 332 is a vibration region where thickness-shear vibration is excited. The pad electrode 333 is disposed on an exterior surface of the thick portion 322, and the pad electrode 334 is disposed on an interior surface of the thick portion 322 so as to oppose the pad electrode 333. The extraction electrode 335 is disposed on an exterior surface of the quartz crystal substrate 32 and electrically connects the excitation electrode 331 and the pad electrode 333 together. The extraction electrode 336 is disposed on an interior surface of the quartz crystal substrate 32 and electrically connects the excitation electrode 332 and the pad electrode 334 together.

Although the vibrator element 31 has been briefly described hereinbefore, the configuration of the vibrator element 31 is not particularly limited. For example, the vibrator element may be a vibrator element using a quartz crystal substrate cut out at a different cut angle, such as a vibrator element using a Z cut quartz crystal substrate, a vibrator element using an ST cut quartz crystal substrate, and a vibrator element using an SC cut quartz crystal substrate. In addition, the vibrator element may be a vibrator element with a piezoelectric element being disposed on a silicon substrate, or may be a surface acoustic wave (SAW) vibrator with an inter digital transducer (IDT) being disposed on a silicon substrate.

As illustrated in FIG. 4, the vibrator element package 39 has a base body 391 and a lid 392. The base body 391 is in a box shape having a recess 391a which opens to the bottom surface. In other words, the base body 391 has a plate-like base portion 391b and a frame-like side wall portion 391c that stretches downwards from outer peripheral portions of the base portion 391b. The lid 392 is bonded to the bottom surface of the base body 391 so as to close an opening of the recess 391a. An accommodation space S is formed by closing the recess 391a with the lid 392 and the vibrator element 31 is accommodated in the accommodation space S. The accommodation space S is in, for example, a depressurized (vacuum) state. However, the atmosphere of the accommodation space S is not particularly limited, and can be changed as appropriate according to a configuration of the vibrator element 31.

Although the configuration material of the base body 391 is not particularly limited, various types of ceramics, for example, aluminum oxide, can be used. Although the configuration material of the lid 392 is not particularly limited, the configuration material may be, for example, a material of which linear expansion coefficient is similar to a linear expansion coefficient of the configuration material of the base body 391. For example, in a case where the configuration material of the base body 391 is the ceramic described above, it is preferable to be an alloy such as Kovar.

As illustrated in FIG. 4, internal terminals 393 and 394 are disposed on the bottom of the recess 391a. As illustrated in FIG. 3, external terminals 395 and 396 (third terminals) and dummy terminals 397 and 398 are disposed on a top surface 391d of the base body 391. Via internal wiring (not illustrated) provided in the base body 391, the internal terminal 393 and the external terminal 395 are electrically connected to each other and the internal terminal 394 and the external terminal 396 are electrically connected to each other. The dummy terminals 397 and 398 are not electrically connected to the vibrator element 31. Each of the external terminals 395 and 396 and the dummy terminals 397 and 398 is electrically connected to the circuit element 4 via the wires W2.

In particular, connecting portions between the external terminals 395 and 396 and the dummy terminals 397 and 398 and the wires W2 overlap the side wall portion 391c in plan view of the top surface 391d. In other words, the external terminals 395 and 396 and the dummy terminals 397 and 398 and the wires W2 are connected to each other immediately above the side wall portion 391c. Consequently, by the side wall portion 391c supporting from below when connecting the wires W2 to the external terminals 395 and 396 and the dummy terminals 397 and 398, the external terminals 395 and 396 and the dummy terminals 397 and 398 can push a capillary and ultrasonic waves can be more efficiently applied to the external terminals 395 and 396 and the dummy terminals 397 and 398. For this reason, the wires W2 and the external terminals 395 and 396 and the dummy terminals 397 and 398 can be more firmly connected to each other. However, the connecting portions between the external terminals 395 and 396 and the dummy terminals 397 and 398 and the wires W2 may not overlap the side wall portion 391c in plan view of the top surface 391d.

The dummy terminals 397 and 398 may not be electrically connected to the terminals 41 via the wires W2. The dummy terminals 397 and 398 may be omitted. Although the external terminals 395 and 396 are disposed diagonally on the top surface 391d, the disposition of the external terminals 395 and 396 is not particularly limited. In addition, the number of the external terminals is not particularly limited, and can be set as appropriate according to a configuration of the vibrator element 31.

As illustrated in FIG. 4, the vibrator element 31 is disposed in the accommodation space S such that the exterior surface (surface on a side where the recessed portion is formed) of the vibrator element faces the base body 391. The vibrator element is fixed to the bottom of the recess 391a by a conductive adhesive 381, and the pad electrode 333 and the internal terminal 393 are electrically connected to each other via the conductive adhesive 381. The pad electrode 334 and the internal terminal 394 are electrically connected to each other via a wire W5. Consequently, electrical connection between the outside of the vibrator element package 39 and the vibrator element 31 can be achieved via the external terminals 395 and 396.

Although the vibrator element package 39 has been described hereinbefore, the configuration of the vibrator element package 39 is not particularly limited. Contrary to the embodiment, for example, the base body 391 may be in a plate shape and the lid 392 may be in a cap shape having a recess (recess that corresponds to the recess 391a of the embodiment) accommodating the vibrator element 31.

With the lid 392 facing the circuit element 4 (lower side), the vibrator 3 having such a configuration is bonded and fixed to the active surface 40, which is the top surface of the circuit element 4, via the die attach member D as illustrated in FIG. 4. By disposing the vibrator 3 in such an orientation, the external terminals 395 and 396 can face the upper side (side opposite to the die pad 21). For this reason, it is easy to dispose (form) the wires W2 that electrically connect the vibrator 3 and the circuit element together. If, for example, a defective component is generated in the oscillator 100, in some cases, a probe pin for inspection is directly pushed against the external terminals 395 and 396 of the vibrator 3 and the vibrator element 31 is directly driven to perform inspection in order to find out a cause. In this case, if the external terminals 395 and 396 face upwards, the external terminals 395 and 396 can be easily exposed and the inspection described above can be easily performed by simply removing the mold portion 24 positioned above the external terminals 395 and 396 by etching.

Herein, the lid 392 is configured of an alloy such as Kovar as described above and is conductive. The lid 392 is electrically connected to the circuit element 4, for example, via any one of the external terminals 395 and 396 and the dummy terminals 397 and 398, and is set so as to have a reference potential (ground). Since such a lid 392 is positioned between the vibrator element 31 and the circuit element 4, the lid 392 can function, for example, as an electromagnetic shield layer that blocks electromagnetic interference between the vibrator element and the circuit element. For this reason, it is possible to stably drive the oscillator 100.

Although the vibrator 3 has been described hereinbefore, the configuration of the vibrator 3 is not particularly limited. For example, the vibrator may be an MEMS chip.

Circuit Element

The circuit element 4 has, for example, an oscillation circuit for oscillating the vibrator element 31, and can output a signal having a predetermined frequency. As illustrated in FIG. 1, such a circuit element 4 is bonded and fixed to the top surface of the die pad 21 via the die attach member D such that the active surface 40 becomes the top surface. As described above, the vibrator 3 is bonded and fixed to the active surface 40 of the circuit element 4 via the die attach member D. That is, the circuit element 4 is positioned between the die pad 21 and the vibrator 3.

As illustrated in FIG. 3, such a circuit element 4 has the plurality of terminals 41 (first terminals) disposed on the active surface 40. Each of the terminals 41 is electrically connected to each of the leads 23 via each of the wires W1. Each of the terminals 41 is provided so as not to overlap the vibrator 3 in plan view of the active surface 40. Consequently, the wires W1 can be easily connected to the terminals 41.

As illustrated in FIG. 3, the circuit element 4 is in a substantially square shape in plan view and has the first side 4a, the second side 4b, the third side 4c, and the fourth side 4d. In addition, the first corner 4ab is formed with the first side 4a and the second side 4b, the second corner 4bc is formed with the second side 4b and the third side 4c, the third corner 4cd is formed with the third side 4c and the fourth side 4d, and the fourth corner 4da is formed with the fourth side 4d and the first side 4a.

The vibrator 3 is in a rectangular shape in plan view and has the first side 3a, the second side 3b, the third side 3c, and the fourth side 3d. In the case of the embodiment, the first side 3a and the third side 3c are long sides and the second side 3b and the fourth side 3d are short sides. In addition, a first corner 3ab is formed with the first side 3a and the second side 3b, a second corner 3bc is formed with the second side 3b and the third side 3c, a third corner 3cd is formed with the third side 3c and the fourth side 3d, and a fourth corner 3da is formed with the fourth side 3d and the first side 3a.

When a clearance between the second side 4b and the fourth side 4d is set as a length X4 of the circuit element 4 and a clearance between the second side 3b and the fourth side 3d set as a length X3 of the vibrator 3, a relationship of X4>X3 is satisfied. Similarly, when a clearance between the first side 4a and the third side 4c is set as a width Y4 of the circuit element 4 and a clearance between the first side 3a and the third side 3c is set as a width Y3 of the vibrator 3, a relationship of Y4>Y3 is satisfied. In addition, when X4−X3=ΔX is set and Y4−Y3=ΔY is set, a relationship of ΔX<ΔY is satisfied.

For this reason, when the vibrator 3 is disposed on the active surface 40 such that length directions of the vibrator and the circuit element become the same direction while matching the centers of the vibrator and the circuit element with a central axis O as illustrated in FIG. 2 described above, each of a region S4a extending along the first side 4a and a region S4c extending along the third side 4c, out of regions of the active surface 40 exposed from the vibrator 3, has a width (a clearance between the first side 4a and the first side 3a and a clearance between the third side 4c and the third side 3c) sufficient to allow the terminals 41 to be disposed therein while each of a region S4b extending along the second side 4b and a region S4d extending along the fourth side 4d does not have a width (a clearance between the second side 4b and the second side 3b and a clearance between the fourth side 4d and the fourth side 3d) sufficient to allow the terminals 41 to be disposed therein.

For this reason, it is necessary to dispose all of the terminals 41 in the regions S4a and S4c. Thus, the terminals 41 are concentrated and the terminals 41 are biasedly disposed on both end portions. For this reason, if each of the terminals 41 and each of leads 23 are connected together with the wires W1, the wires W1 interfere with each other and thus it is difficult to connect each of the wires W1 to each of the terminals 41. For example, it is difficult to dispose the wires W1 illustrated with the dashed lines in FIG. 2.

In order to dispose the terminals 41 and relatively easily connect the wires W1 to the terminals 41 using a wire bonding technique, it is preferable that the width is, for example, 300 μm or longer, preferably 500 μm or longer although the width varies depending on the height of the vibrator 3 and the shape of the capillary. That is, when each of widths Z of the regions S4b and S4d falls short of 300 μm (in other words, ΔX falls short of 600 μm), the problem described above occurs more conspicuously.

In the oscillator 100, the vibrator 3 is rotated about the central axis O counterclockwise with respect to the disposition of the related art illustrated in FIG. 2, and the vibrator 3 is disposed such that the length direction of the vibrator 3 is tilted with respect to each of the length direction and a width direction of the circuit element 4 as illustrated in FIG. 3. More specifically, the vibrator 3 is disposed such that, in plan view of the active surface 40, the first side 3a extends in a direction intersecting each of the fourth side 4d and the first side 4a of the circuit element 4, the second side 3b extends in a direction intersecting each of the first side 4a and the second side 4b of the circuit element 4, the third side 3c extends in a direction intersecting each of the second side 4b and the third side 4c of the circuit element 4, and the fourth side 3d extends in a direction intersecting each of the third side 4c and the fourth side 4d of the circuit element 4. That is, the first side 3a, the second side 3b, the third side 3c, and the fourth side 3d are not in parallel with the first side 4a, the second side 4b, the third side 4c, and the fourth side 4d, respectively.

Consequently, it can be ensured that each of the region S4a extending along the first side 4a, the region S4b extending along the second side 4b, the region S4c extending along the third side 4c, and the region S4d extending along the fourth side 4d has a width (300 μm or longer, preferably 500 μm or longer) sufficient to allow the terminals 41 to be disposed therein. For this reason, the terminals 41 can be disposed along the first side 4a, the second side 4b, the third side 4c, and the fourth side 3d, and thus the concentration of the terminals 41 and a bias in regions where the terminals 41, which occur in the configuration illustrated in FIG. 2, are disposed are eased. Therefore, each of the wires W1 can be easily connected to each of the terminals 41 and interference between the wires W1 can be suppressed.

Since the region S4a includes the fourth corner 4da, the region S4b includes the first corner 4ab, the region S4c includes the second corner 4bc, and the region S4d includes the third corner 4cd, it can be said that each of the terminals 41 is disposed on each of the first corner 4ab, the second corner 4bc, the third corner 4cd, and the fourth corner 4da in the oscillator 100.

In particular, in the embodiment, each of the first corner 3ab, the second corner 3bc, the third corner 3cd, and the fourth corner 3da of the vibrator 3 is positioned outside the circuit element 4 in plan view of the active surface 40. Specifically, the first corner 3ab protrudes from the first side 4a to the outside of the active surface 40, the second corner 3bc protrudes from the second side 4b to the outside of the active surface 40, the third corner 3cd protrudes from the third side 4c to the outside of the active surface 40, and the fourth corner 3da protrudes from the fourth side 4d to the outside of the active surface 40. By some parts of the vibrator 3 protruding to the outside of the active surface 40 as described above, the areas of regions of the active surface 40 that do not overlap the vibrator 3 can be increased compared to a case where some part do not protrude. That is, the areas of the regions S4a, S4b, S4c, and S4d can be increased and thus the concentration of the terminals 41 can be further reduced. For this reason, each of the wires W1 can be more easily connected to each of the terminals 41 and interference between the wires W1 can be suppressed.

Although all of the first corner 3ab, the second corner 3bc, the third corner 3cd, and the fourth corner 3da of the vibrator 3 are positioned outside the circuit element 4 in the embodiment, at least one, out of the corners, may be positioned outside the circuit element 4 and with this, the effect described above can be demonstrated.

When the area of the circuit element 4 is set as M1 and the area of the vibrator 3 is set as M2 in plan view of the active surface 40, 0.5≤M2/M1≤1 is preferable and 0.7≤M2/M1≤1 is more preferable. Consequently, since the regions of the active surface 40 that do not overlap the vibrator 3, that is, the regions where the terminals 41 can be disposed are likely to be decreased, an effect of obliquely disposing the vibrator 3 described above is more conspicuous.

Each of the wires W1 is disposed so as not to straddle the vibrator 3. In other words, the vibrator 3 is not positioned between a set of the terminal 41 and the lead 23 connected with the wire W1. Consequently, the height of the wire W1 (height of an uppermost portion of a loop) can be restricted to be low and thus the height of the oscillator 100 can be made low. In addition, the contact of the wires W1 with the vibrator 3 can be suppressed and damage to the wires W1 can be effectively suppressed.

The oscillator 100 to which the vibrator device 1 is applied has been described hereinbefore. As described above, the vibrator device 1 (oscillator 100) has the terminals 41 (first terminals), and has the circuit element 4, which is a quadrangle in plan view, the vibrator 3, which is disposed on the circuit element 4 and is a quadrangle in plan view, and the base 20, on which the circuit element 4 is disposed and which has the leads 23 (second terminals), and the wires W1 which connect the terminals 41 and the leads 23 together. In plan view of the circuit element 4, the vibrator 3 is disposed such that at least one side extends in a direction where one side intersects each of two adjacent sides of the circuit element 4 and such that the vibrator does not overlap the terminals 41. Consequently, the concentration of the terminals 41 on the active surface 40 and a bias in the regions where the terminals 41 are disposed can be suppressed. For this reason, each of the wires W1 can be connected to each of the terminals 41 and interference between the wires W1 can be suppressed.

As described above, in the vibrator device 1 (oscillator 100), at least one corner of the vibrator 3 is positioned outside the circuit element 4 in plan view. Consequently, the areas of the regions of the active surface 40 that do not overlap the vibrator 3 can be increased. For this reason, the concentration of the terminals 41 on the active surface 40 can be reduced. Therefore, each of the wires W1 can be more easily connected to each of the terminals 41 and interference between the wires W1 can be suppressed. In the embodiment, such an effect is more conspicuous since all of the corners (the first corner 3ab, the second corner 3bc, the third corner 3cd, and the fourth corner 3da) of the vibrator 3 are positioned outside the circuit element 4.

As described above, in the vibrator device 1 (oscillator 100), when the area of the circuit element 4 is set as M1 and the area of the vibrator 3 is set as M2 in plan view, 0.5≤M2/M1≤1 is satisfied. Consequently, since the regions of the active surface 40 that do not overlap the vibrator 3, that is, the regions where the terminals 41 can be disposed are likely to be decreased, an effect of obliquely disposing the vibrator 3 described above is more conspicuous.

As described above, in the vibrator device 1 (oscillator 100), in plan view, the plurality of leads 23 (second terminals) are disposed around the perimeter of the circuit element 4 and along each of the four sides (the first side 4a, the second side 4b, the third side 4c, and the fourth side 4d) of the circuit element 4. By disposing the leads 23 along the perimeter of the circuit element 4 as described above, the number of the leads 23 is likely to increase and the wires W1 are likely to be concentrated. For this reason, an effect of obliquely disposing the vibrator 3 described above is more conspicuous.

As described above, in the vibrator device 1 (oscillator 100), the vibrator 3 has the vibrator element 31 and the vibrator element package 39 accommodating the vibrator element 31. Consequently, the configuration of the vibrator 3 is simple.

As described above, in the vibrator device 1 (oscillator 100), the vibrator element package 39 has the external terminals 395 and 396 (third terminals) disposed on the top surface 391d (surface on a side opposite to the circuit element 4). Consequently, since the external terminals 395 and 396 and the terminals 41 together face the upper side, it is easy to connect the terminals together with the wires W2.

As described above, the vibrator device 1 (oscillator 100) has the mold portion 24, which is disposed on the base 20 and covers the circuit element 4 and the vibrator 3. Consequently, the vibrator 3 and the circuit element 4 can be protected from moisture, dust, and shock, and thus the reliability of the vibrator device 1 (oscillator 100) improves.

As described above, the oscillator 100 has the vibrator device 1. For this reason, the effect of the vibrator device 1 described above can be enjoyed and high reliability can be demonstrated.

Although a configuration where the package 2 is a QFN package has been described in the embodiment, the package 2 is not particularly limited. For example, a quad flat package (QFP), a dual flat package (DFP), a ball grid array (BGA), a small outline package (SOP), and a dual flat no-leaded (DFN) package may be used. In addition, for example, a ceramic package such as the vibrator element package 39 may be used.

Although a relationship between the size of the circuit element 4 and the size of the vibrator 3 satisfies X4>X3 and Y4>Y3 in the embodiment, the relationship is not particularly limited. For example, the relationship may satisfy X4≤X3, may satisfy Y4≤Y3, or may satisfy ΔX≥ΔY.

Although the circuit element 4 has a substantially square shape in plan view in the embodiment, the circuit element 4 is not particularly limited insofar as the circuit element is a quadrangle in plan view. For example, the circuit element may be a rectangle, a parallelogram, or a trapezoid. Similarly, although the vibrator 3 has a substantially rectangular shape in plan view in the embodiment, the vibrator 3 is not particularly limited insofar as the vibrator is a quadrangle in plan view. For example, the vibrator may be a square, a parallelogram, a trapezoid, or another type of quadrangle. Herein, in addition to a shape that completely matches a quadrangle, the term "quadrangle" means, for example, a shape that can be equated with a quadrangle of which at least one corner is curved in a projected shape or a recessed shape, of which at least one corner is cut out, or of which all or a part of at least one side is curved or bent.

Second Embodiment

Next, an oscillator (vibrator device) according to a second embodiment of the invention will be described.

Figure 6:
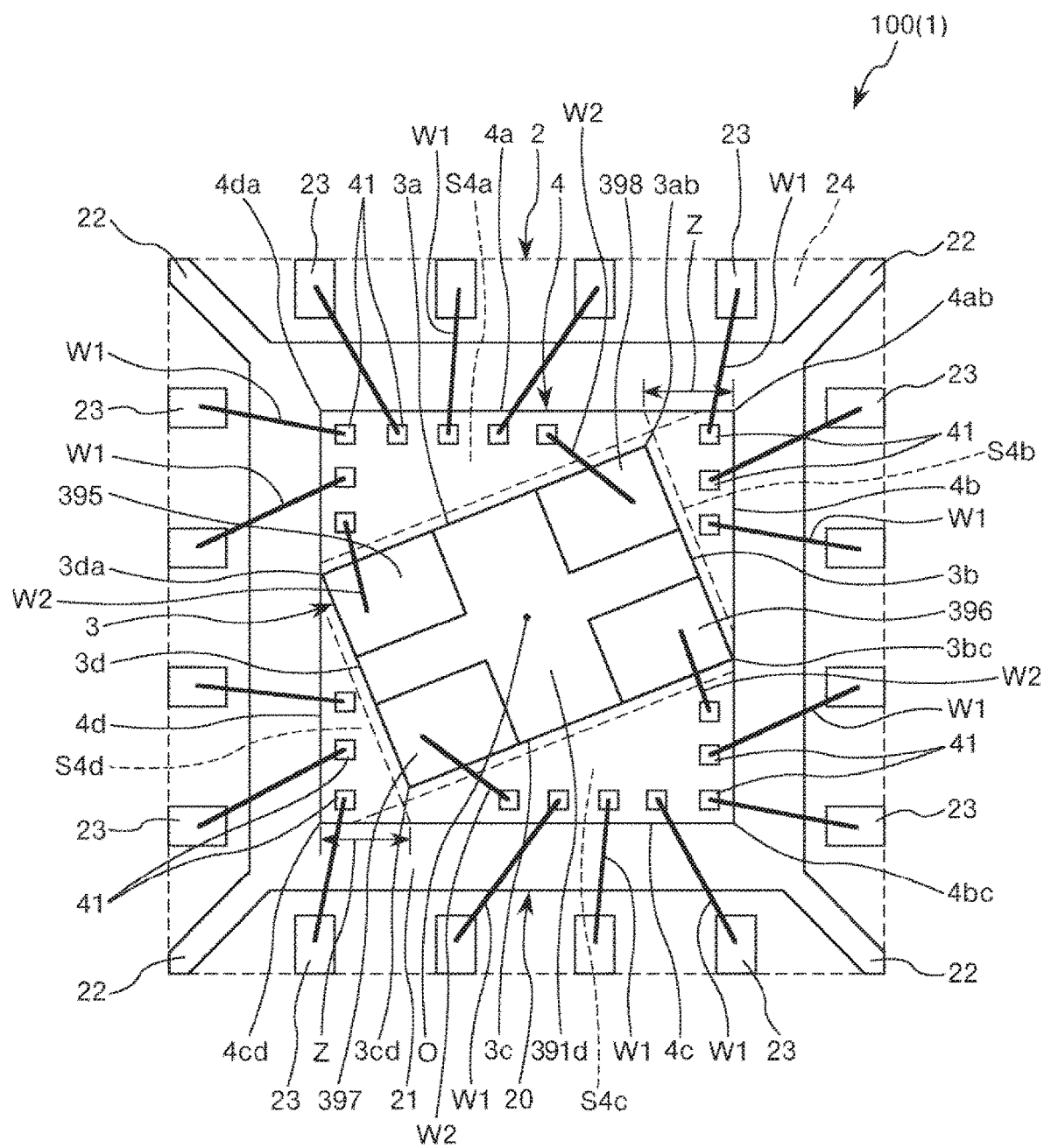
FIG. 6 is a plan view illustrating an oscillator (vibrator device) according to a second embodiment of the invention.

FIG. 6 is a plan view illustrating the oscillator (vibrator device) according to the second embodiment of the invention.

Hereinafter, differences between the oscillator of the second embodiment and the oscillator of the first embodiment described above will be mainly described, and the description of the same facts will be omitted.

The oscillator of the second embodiment is mainly the same as the oscillator of the first embodiment described above except that the disposition of the vibrator 3 is different. In FIG. 6, the same configuration as in the embodiment described above will be assigned with the same reference sign.

As illustrated in FIG. 6, in the oscillator 100 (vibrator device 1) of the embodiment, the vibrator 3 is disposed such that the length direction of the vibrator 3 is tilted with respect to each of the length direction and the width direction of the circuit element 4, as in the first embodiment described above. However, in the embodiment, each corner (the first corner 3ab, the second corner 3bc, the third corner 3cd, and the fourth corner 4da) of the vibrator 3 protrudes from the circuit element 4. In the embodiment, the second corner 3bc and the fourth corner 3da are in contact with the outline of the active surface 40, and the first corner 3ab and the third corner 3cd are positioned inside the outline of the active surface 40. More specifically, the second corner 3bc is in contact with the second side 4b, the fourth corner 3da is in contact with the fourth side 4d, the first corner 3ab is spaced apart from the first side 4a, and the third corner 3cd is spaced apart from the third side 4c.

Even if the vibrator 3 is disposed as described above, a width that is sufficient to allow the terminals 41 to be disposed can be ensured for each of the regions S4a, S4b, S4c, and S4d, as in the first embodiment described above. For this reason, the concentration of the terminals 41 can be suppressed. In addition, a bias of the terminals 41 can also be suppressed since the terminals 41 can be disposed in balance on the four corners of the active surface 40. Accordingly, each of the wires W1 can be connected to each of the terminals 41 and interference between the wires W1 can be suppressed.

In addition, if the second corner 3bc and the fourth corner 3da are in contact with the outline of the active surface 40, the widths Z of the regions S4b and S4d can be increased compared to a case where, for example, all of the first corner 3ab, the second corner 3bc, the third corner 3cd, and the fourth corner 4da are positioned inside the outline of the active surface 40. In the embodiment, the widths of the regions S4b and S4d are shorter than the widths of the regions S4a and S4c since the circuit element 4 is a square in plan view while the vibrator 3 is in a rectangular shape in plan view. For this reason, more terminals 41 can be disposed more reliably in the regions S4b and S4d by increasing the widths of the regions S4b and S4d as in the embodiment. For this reason, the terminals 41 can be can be disposed in balance in the regions S4a, S4b, S4c, and S4d, and thus the concentration of the terminals 41 can be further suppressed.

Although the second corner 3bc and the fourth corner 3da of the vibrator 3 are in contact with the outline of the circuit element 4 in the embodiment, at least one corner, out of the first corner 3ab, the second corner 3bc, the third corner 3cd, and the fourth corner 3da, may be in contact with the outline of the circuit element 4. With this, the effect described above can be demonstrated.

The oscillator of the second embodiment 100 has been described hereinbefore. As described above, in such a vibrator device 1, at least one corner of the vibrator 3 is in contact with the outline of the circuit element 4 in plan view. Consequently, as described above, the terminals 41 can be disposed in balance in the regions of the active surface 40 that do not overlap the vibrator 3 and thus the concentration of the terminals 41 can be suppressed. For this reason, each of the wires W1 can be more easily connected to each of the terminals 41 and interference between the wires W1 can be suppressed.

In such a second embodiment, the same effect as in the first embodiment described above can be demonstrated.

Third Embodiment

Next, an oscillator (vibrator device) according to a third embodiment of the invention will be described.

Figure 7:
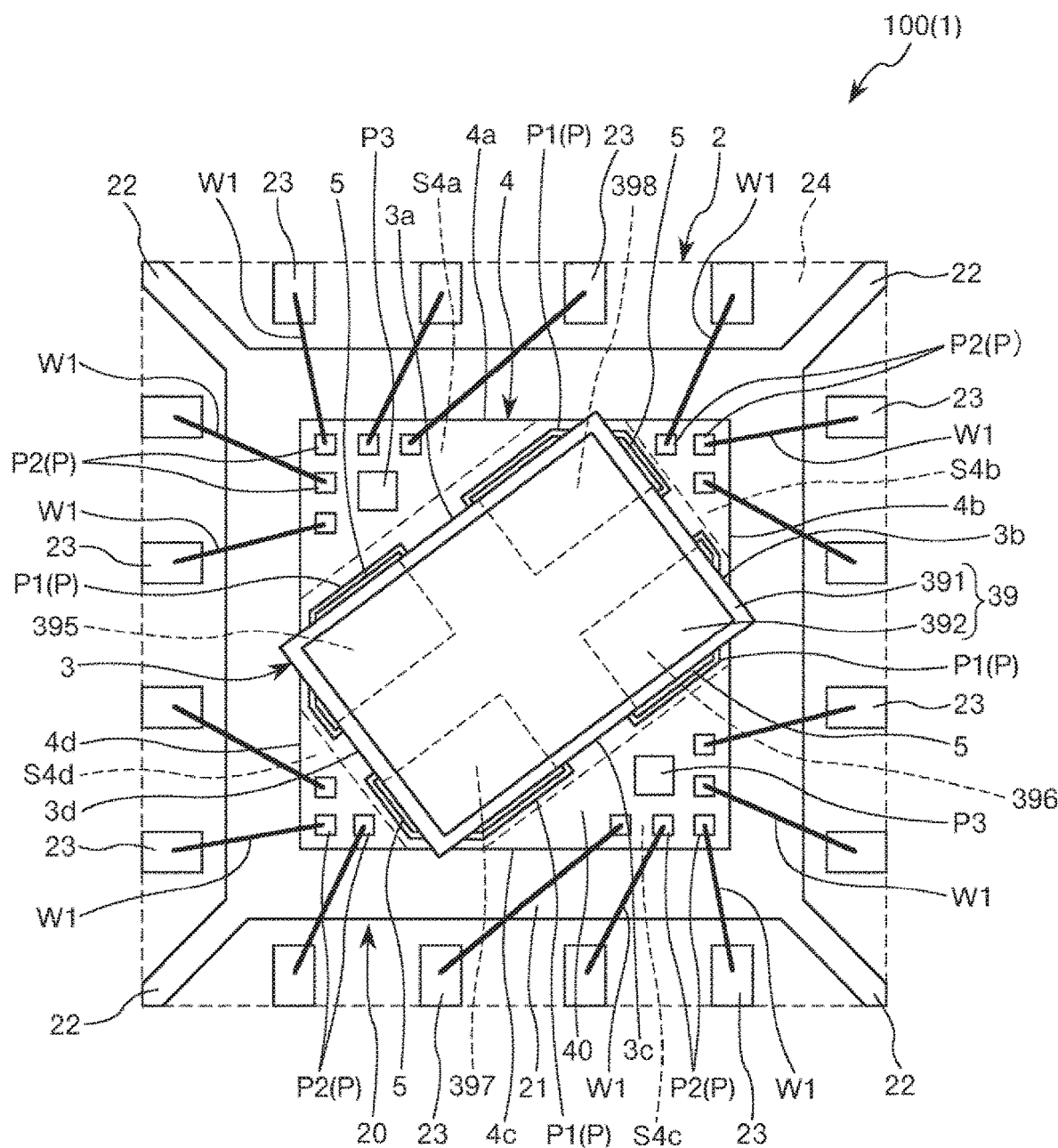
FIG. 7 is a plan view illustrating an oscillator (vibrator device) according to a third embodiment of the invention.
Figure 8:
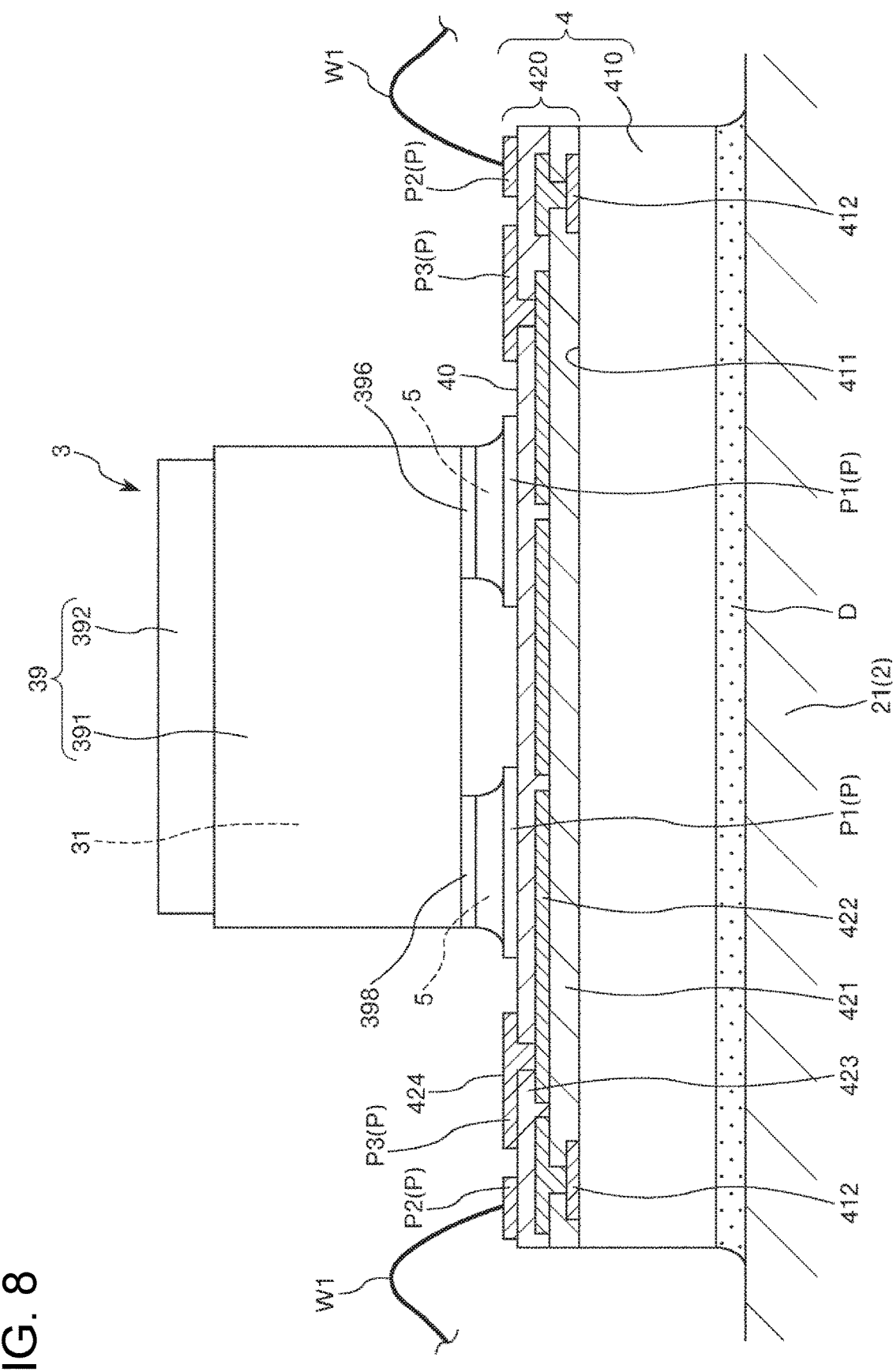
FIG. 8 is a sectional view of a circuit element of the oscillator illustrated in FIG. 7.

FIG. 7 is a plan view illustrating the oscillator (vibrator device) according to the third embodiment of the invention. FIG. 8 is a sectional view of a circuit element of the oscillator illustrated in FIG. 7.

Hereinafter, differences between the oscillator of the third embodiment and the oscillator of the first embodiment described above will be mainly described, and the description of the same facts will be omitted.

The oscillator of the third embodiment is mainly the same as the oscillator of the first embodiment described above except that the disposition of the vibrator 3 and the configuration of the circuit element 4 are different. In FIGS. 7 and 8, the same configuration as in the embodiment described above will be assigned with the same reference sign.

As illustrated in FIG. 7, in the oscillator 100 (vibrator device 1) of the embodiment, the orientation of the vibrator 3 is opposite to the orientation in the first embodiment described above. That is, the vibrator 3 is disposed such that a surface where the external terminals 395 and 396 (third terminals) and the dummy terminals 397 and 398 are disposed faces the circuit element 4. The vibrator 3 is bonded and fixed to the top surface of the circuit element 4 via conductive connecting members 5.

As illustrated in FIG. 8, the circuit element 4 has a circuit element main body 410, which has the terminals 412 on a top surface 411, and a redisposing wiring layer 420 disposed on the top surface 411. Various types of circuits, such as the oscillation circuit described above, are formed in the circuit element main body 410. The redisposing wiring layer 420 has a function of redisposing the terminals 412 provided on the top surface 411 of the circuit element main body 410 as connection pads P. By having such a redisposing wiring layer 420, the disposition of the connection pads P can be freely set without being affected by the disposition of the terminals 412. For this reason, various types of circuits having different disposition of the terminals 412 can be used as the circuit element main body 410. That is, it is not necessary to design the disposition of the terminals 412 exclusive to the oscillator 100. Accordingly, for example, the cost of the oscillator 100 can be reduced.

In addition, the redisposing wiring layer 420 has a first insulating layer 421 stacked on the top surface 411 of the circuit element main body 410, a first wiring layer 422 that is stacked on the first insulating layer 421 and is electrically connected to the terminals 412, a second insulating layer 423 stacked on the first insulating layer 421 and the first wiring layer 422, and a second wiring layer 424 that is stacked on the second insulating layer 423 and is electrically connected to the first wiring layer 422. The configuration of the redisposing wiring layer 420 is not particularly limited. For example, the redisposing wiring layer may have one insulating layer and one wiring layer, or may have three or more insulating layers and three or more wiring layers. In addition, the outermost surface may have a passivation film that protects the second wiring layer 424.

In the circuit element 4 having such a configuration, the top surface (that is, a top surface of the second insulating layer 423) of the circuit element is the active surface 40. Configuration materials of the first and second insulating layers 421 and 423 are not particularly limited. For example, various types of resin materials, such as polyimide, an epoxy resin, an acrylic resin, and a phenol resin, and silicon oxide can be used. In addition, configuration materials of the first and second wiring layers 422 and 424 are not particularly limited. For example, various types of metals such as gold (Au), platinum (Pt), copper (Cu), aluminum (Al), and magnesium (Mg), and alloys including at least one type of the metals can be used.

As illustrated in FIG. 8, the second wiring layer 424 disposed on the active surface 40 has the plurality of connection pads P. The plurality of connection pads P include a plurality of first connection pads P1, a plurality of second connection pads P2, and a plurality of third connection pads P3. Out of the connection pads, each of the first connection pads P1 and the second connection pads P2 is electrically connected to each of the terminals 412 of the circuit element main body 410 via the first wiring layer 422. In addition, the third connection pads P3 are electrically connected to the first connection pads P1 via the first wiring layer 422. Each of the first connection pads P1 is a terminal connected to the vibrator 3, each of the second connection pads P2 is a terminal (second terminal) connected to the lead 23, and each of the third connection pads P3 is a terminal for inspection.

As illustrated in FIG. 7, the four first connection pads P1 are disposed on the active surface 40. In addition, each of the four first connection pads P1 is disposed so as to oppose each of the external terminals 395 and 396 and the dummy terminals 397 and 398 of the vibrator 3. The number of the first connection pads P1 is not particularly limited, and can be set as appropriate according to the number of external terminals and dummy terminals of the vibrator 3.

Each of the conductive connecting members 5 is provided between each of the four first connection pads P1 and each of the external terminals 395 and 396 and the dummy terminals 397 and 398. The vibrator 3 and the circuit element 4 are bonded together via the connecting members 5, and the four first connection pads P1 are electrically connected to the external terminals 395 and 396 and the dummy terminals 397 and 398 via the connecting members 5. Consequently, the circuit element 4 and the vibrator 3 are electrically connected to each other. By electrically connecting the vibrator 3 and the circuit element 4 together via the connecting members 5 as described above, the height of the oscillator 100 can be made low, for example, compared to a case where the wires W2 are used as in the first embodiment described above.

The conductive connecting members 5 are not particularly limited. For example, a conductive adhesive obtained by mixing a conductive filler into various types of epoxy-based, acryl-based, and silicone-based adhesives, solder, and a metal brazing material can be used.

It is preferable that each of the dummy terminals 397 and 398, which are not electrically connected to the vibrator element 31, is connected to ground and potentials remain constant. Consequently, a change in the potentials of the dummy terminals 397 and 398 due to an effect from the surroundings can be suppressed, and thus noises are unlikely to occur. For this reason, the reliability of the oscillator 100 improves. However, the dummy terminals 397 and 398 may not be electrically connected to the circuit element 4, or may be in an electrically floating state.

As illustrated in FIG. 7, the sixteen second connection pads P2 (first terminals) are disposed on the active surface 40. The second connection pads P2 are disposed separately in the regions S4a, S4b, S4c, and S4d. Each of the second connection pads P2 is electrically connected to each of the leads 23 via each of the wires W1.

As illustrated in FIG. 7, the two third connection pads P3 are disposed on the active surface 40. Each of the third connection pads P3 is disposed so as not to overlap the vibrator 3. In other words, when the circuit element 4 is seen from above, each of the third connection pads P3 is disposed so as to be exposed from the vibrator 3 without being hidden under the vibrator 3. One third connection pad P3 is electrically connected to the first connection pad P1 connected to the external terminal 395 via the first wiring layer 422, and the other third connection pad P3 is electrically connected to the first connection pad P1 connected to the external terminal 396 via the first wiring layer 422. However, the third connection pads P3 may be electrically connected to the first connection pad P1 via the second wiring layer 424 instead of the first wiring layer 422.

Such third connection pads P3 are connection pads for inspection used when inspecting the vibrator 3. In the first embodiment described above, the probe pin for inspection can be directly pushed against the external terminals 395 and 396 during inspection since the external terminals 395 and 396 face the upper side. On the other hand, in the embodiment, the probe pin for inspection cannot be directly pushed against the external terminals 395 and 396 since the external terminals 395 and 396 face the lower side. Thus, in the embodiment, the third connection pads P3 electrically connected to the external terminals 395 and 396 are provided so as to press the probe pin against the third connection pads P3. Since the third connection pads P3 are positioned on the active surface 40 so as not to overlap the vibrator 3 as described above, the third connection pads can be easily exposed by removing a part of the mold portion 24 by etching. For this reason, the inspection described above can be more easily performed.

In such a third embodiment, the same effect as in the first embodiment described above can be demonstrated.

Fourth Embodiment

Next, an electronic device according to a fourth embodiment of the invention will be described.

Figure 9:
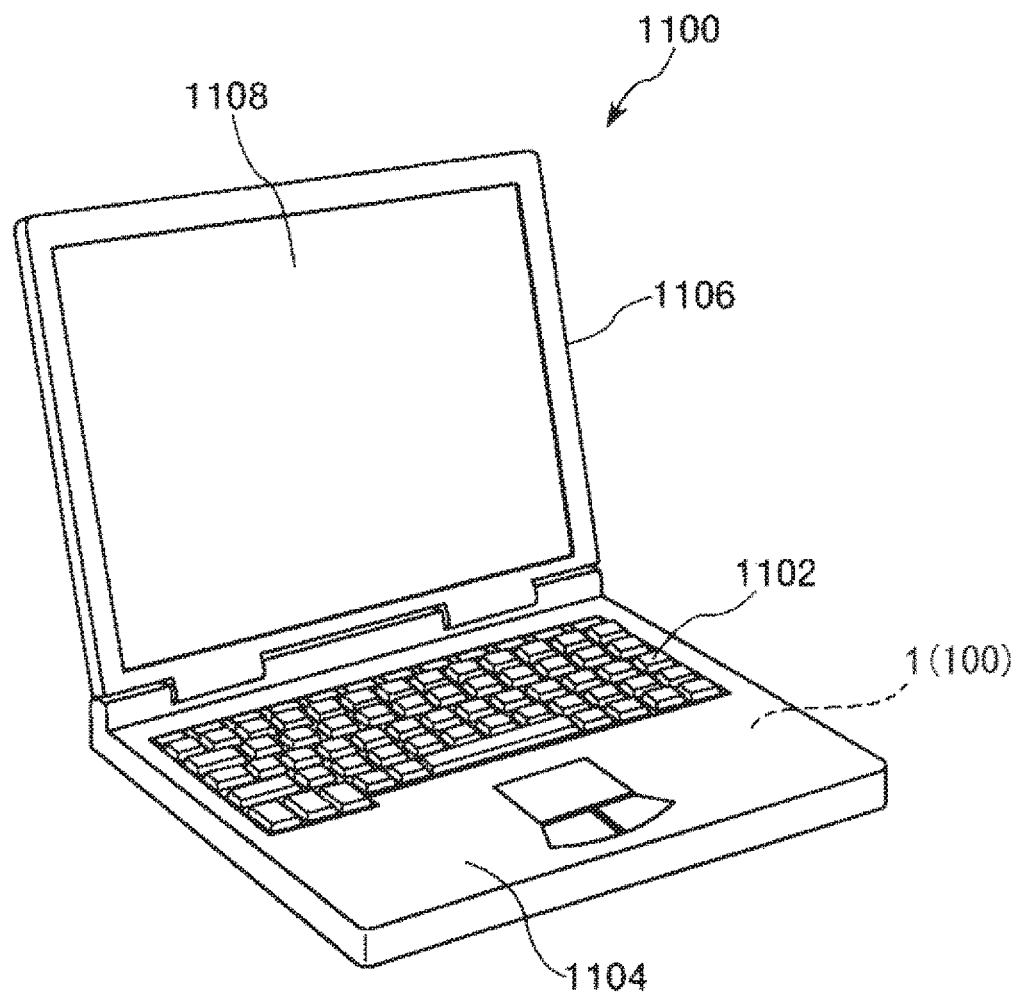
FIG. 9 is a perspective view illustrating an electronic device according to a fourth embodiment of the invention.

FIG. 9 is a perspective view illustrating the electronic device according to the fourth embodiment of the invention.

A mobile type (or note type) personal computer 1100 illustrated FIG. 9 is a computer to which the electronic device including the vibrator device according to the invention is applied. In this figure, the personal computer 1100 is configured of a main body unit 1104 including a keyboard 1102 and a display unit 1106 including a display 1108. The display unit 1106 is supported via a hinge structure so as to be rotatable with respect to the main body unit 1104. The oscillator 100 (vibrator device 1) is mounted inside such a personal computer 1100.

Such a personal computer 1100 (electronic device) has the vibrator device 1. For this reason, the effect of the vibrator device 1 described above can be enjoyed and high reliability can be demonstrated.

Fifth Embodiment

Next, an electronic device according to a fifth embodiment of the invention will be described.

Figure 10:
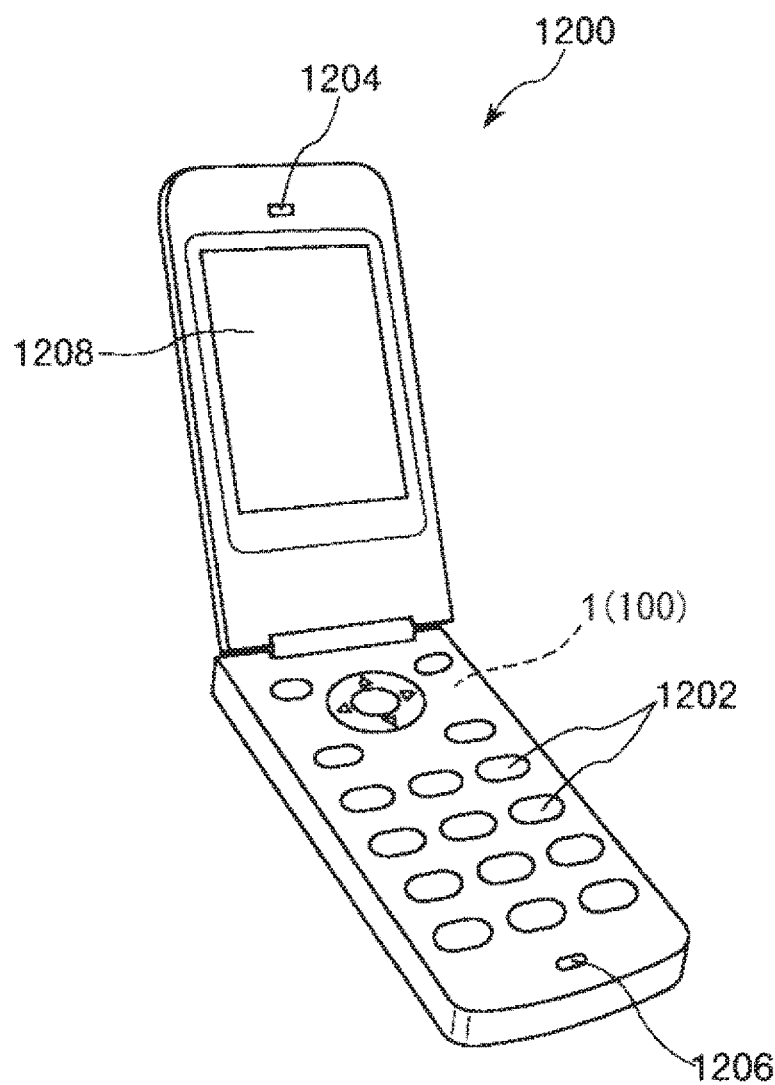
FIG. 10 is a perspective view illustrating an electronic device according to a fifth embodiment of the invention.

FIG. 10 is a perspective view illustrating the electronic device according to the fifth embodiment of the invention.

A mobile phone 1200 (including a PHS as well) illustrated in FIG. 10 is a phone to which the electronic device including the vibrator device according to the invention is applied. In this figure, the mobile phone 1200 includes an antenna (not illustrated), a plurality of operation buttons 1202, ear piece 1204, and a mouth piece 1206. A display 1208 is disposed between the operation buttons 1202 and the earpiece 1204. The oscillator 100 (vibrator device 1) is mounted inside such a mobile phone 1200.

Such a mobile phone 1200 (electronic device) has the vibrator device 1. For this reason, the effect of the vibrator device 1 described above can be enjoyed and high reliability can be demonstrated.

Sixth Embodiment

Next, an electronic device according to a sixth embodiment of the invention will be described.

Figure 11:
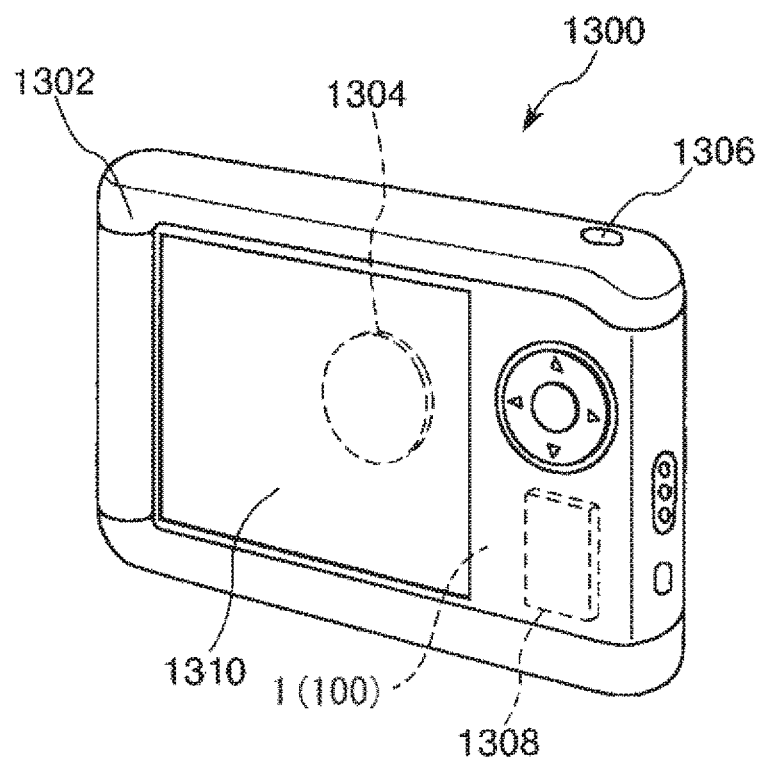
FIG. 11 is a perspective view illustrating an electronic device according to a sixth embodiment of the invention.

FIG. 11 is a perspective view illustrating the electronic device according to the sixth embodiment of the invention.

A digital still camera 1300 illustrated in FIG. 11 is a camera to which the electronic device including the vibrator device according to the invention is applied. In this figure, a display 1310 is provided on the back surface of a case (body) 1302, and is configured to perform display based on an imaging signal from a CCD. The display 1310 functions as a viewfinder displaying a subject as an electronic image. In addition, a light receiving unit 1304 including an optical lens (imaging optical system) and the CCD is provided on a front surface side (interior surface side in this figure) of the case 1302. When a photographer checks a subject image displayed on the display 1310 and presses a shutter button 1306, an imaging signal from the CCD at that time point is transmitted to and is stored in a memory 1308. The oscillator 100 (vibrator device 1) is mounted inside such a digital still camera 1300.

Such a digital still camera 1300 (electronic device) has the vibrator device 1. For this reason, the effect of the vibrator device 1 described above can be enjoyed and high reliability can be demonstrated.

In addition to the personal computer, the mobile phone, and the digital still camera, the electronic device according to the invention can be applied to, for example, a smartphone, a tablet terminal, a watch (including a smartwatch), an ink jet discharging apparatus (for example, an ink jet printer), a laptop personal computer, a television, wearable terminals such as a HMD (head mounted display), a video camera, a video tape recorder, a car navigation device, a pager, an electronic notebook (including an electronic notebook with a communication function as well), an electronic dictionary, a calculator, an electronic game device, a word processor, a workstation, a viedophone, a television monitor for crime prevention, an electronic binoculars, a POS terminal, medical devices (for example, an electronic thermometer, a sphygmomanometer, a blood glucose meter, an electrocardiogram measuring device, an ultrasonic diagnostic apparatus, and an electronic endoscope), a fish finder, various types of measuring devices, a mobile terminal base station apparatus, meters (for example, meters of a car, an aircraft, and a ship), a flight simulator, and a network server.

Seventh Embodiment

Next, a vehicle according to a seventh embodiment of the invention will be described.

Figure 12:
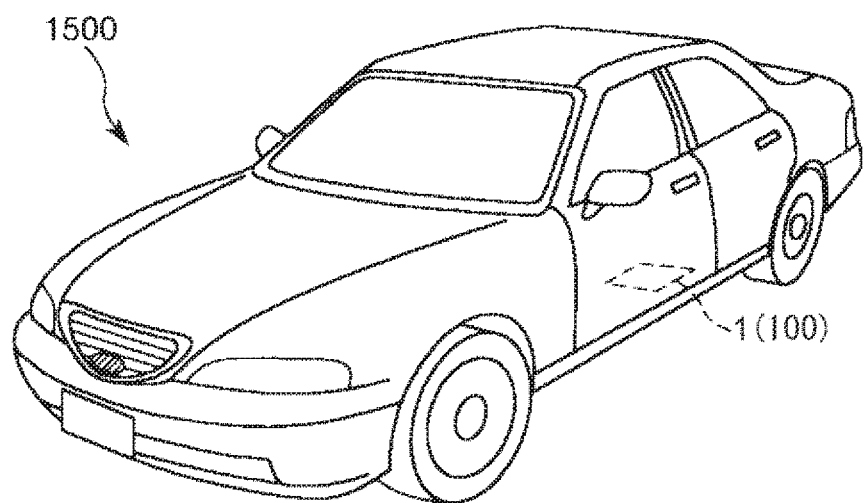
FIG. 12 is a perspective view illustrating a vehicle according to a seventh embodiment of the invention.

FIG. 12 is a perspective view illustrating the vehicle according to the seventh embodiment of the invention.

An automobile 1500 illustrated in FIG. 12 is an automobile to which the vehicle including the vibrator device according to the invention is applied. In this figure, the oscillator 100 (vibrator device 1) is mounted inside the automobile 1500. The oscillator 100 (vibrator device 1) can be widely applied to, for example, a keyless entry, an immobilizer, a car navigation system, a car air conditioner, an anti-lock brake system (ABS), an air bag, a tire pressure monitoring system (TPMS), an engine control, a battery monitor of a hybrid automobile or an electric automobile, and an electronic control unit (ECU) such as a car body posture control system.

Such an automobile 1500 (vehicle) has the vibrator device 1. For this reason, the effect of the vibrator device 1 described above can be enjoyed and high reliability can be demonstrated.

The vehicle is not limited to the automobile 1500, and can also be applied to, for example, an airplane, a ship, an automatic guided vehicle (AGV), a bipedal walking robot, and an unmanned airplane such as a drone.

Although the vibrator device, the oscillator, the electronic device, and the vehicle according to the invention have been described hereinbefore based on the illustrated embodiments, the invention is not limited thereto. A configuration of each unit can be substituted with any configuration having the same function. Any other configuration elements may be added to the invention. In addition, the invention may be a combination of any two or more configurations (characteristics) out of each of the embodiments.

Although a configuration where at least one corner of the vibrator is positioned outside the circuit element in plan view (the first embodiment described above) and a configuration where at least one corner of the vibrator is in contact with the outline of the circuit element (the second embodiment described above) have been described in the embodiments described above, the disposition of the vibrator is not particularly limited insofar as the vibrator does not overlap the terminals (first terminals) of the circuit element and is obliquely disposed with respect to the circuit element. That is, the disposition of the vibrator is not particularly limited insofar as the vibrator is disposed such that at least one side of the vibrator extends in the direction where one side intersects each of two adjacent sides of the circuit element and such that the vibrator does not overlap the first terminals. For example, each corner of the vibrator may be positioned inside the outline of the circuit element.

In addition, although a configuration where the vibrator device is applied to the oscillator has been described in the embodiments described above, the configuration is not limited thereto. For example, the vibrator device may be applied to a physical quantity sensor that can detect a physical quantity such as acceleration and angular velocity. In this case, for example, a vibrator element that can detect angular velocity and acceleration may be used as the vibrator element of the vibrator, and a circuit element including a drive circuit that drives the vibrator element and a detection circuit that detects a physical quantity according to an output from the vibrator element may be used as the circuit element.

The entire disclosure of Japanese Patent Application No. 2017-049700, filed Mar. 15, 2017 is expressly incorporated by reference herein.

What is claimed is:

1. An oscillator comprising:
a circuit element having a first surface and a second surface opposite to the first surface, having a first terminal on the first surface and being a quadrangle in plan view;
a base on which the circuit element is disposed such that the second surface of the circuit element faces the base and which has a second terminal;
a vibrator that has a vibrator element including a quartz crystal substrate and an electrode formed on the quartz crystal substrate, a vibrator element package configured by a base body and a lid and accommodating the vibrator element, and a third terminal disposed on a surface of the base body opposite to the lid, the vibrator being a quadrangle in plan view and being disposed on the circuit element with the lid facing the first surface of the circuit element; and
a wire that connects the first terminal and the second terminal across a thickness of the circuit element,
wherein in plan view of the circuit element, at least one side of the vibrator is disposed along a direction where the one side intersects each of two adjacent sides of the circuit element, and the vibrator does not overlap the first terminal.

2. The oscillator according to claim 1,
wherein in the plan view, any one of corners of the vibrator is positioned outside the circuit element.

3. The oscillator according to claim 1,
wherein in the plan view, any one of corners of the vibrator is in contact with an outline of the circuit element.

4. The oscillator according to claim 1,
wherein when an area of the circuit element is set as M1 and an area of the vibrator is set as M2 in the plan view, $0.5 \leq M2/M1 \leq 1$ is satisfied.

5. The oscillator according to claim 1,
wherein in the plan view, the plurality of second terminals are disposed on a perimeter of the circuit element and along each of four sides of the circuit element.

6. The oscillator according to claim 1, further comprising:
a mold portion that is provided on the base and covers the circuit element and the vibrator.

7. An electronic device comprising the oscillator according to claim 1.

8. A vehicle comprising the oscillator according to claim 1.

9. The oscillator according to claim 1,
wherein the lid is configured by a conductive material and is electrically connected to the circuit element to have a reference potential.

* * * * *